USO11011627B2

(12) United States Patent
Wang

(10) Patent No.: US 11,011,627 B2
(45) Date of Patent: May 18, 2021

(54) SEMICONDUCTOR STRUCTURE AND METHOD FOR THE FORMING SAME

(71) Applicants: Semiconductor Manufacturing International (Beijing) Corporation, Beijing (CN); Semiconductor Manufacturing International (Shanghai) Corporation, Shanghai (CN)

(72) Inventor: Nan Wang, Shanghai (CN)

(73) Assignees: Semiconductor Manufacturing (Beijing) International Corporation, Beijing (CN); Semiconductor Manufacturing (Shanghai) International Corporation, Shanghai (CN)

( * ) Notice: Subject to any disclaimer, the term of this patent is extended or adjusted under 35 U.S.C. 154(b) by 0 days.

(21) Appl. No.: 16/601,883

(22) Filed: Oct. 15, 2019

(65) Prior Publication Data

US 2020/0212195 A1    Jul. 2, 2020

(30) Foreign Application Priority Data

Dec. 26, 2018 (CN) .......................... 201811605465.4

(51) Int. Cl.
*H01L 29/66* (2006.01)
*H01L 21/8234* (2006.01)
(Continued)

(52) U.S. Cl.
CPC ...... *H01L 29/6681* (2013.01); *H01L 21/0214* (2013.01); *H01L 21/0228* (2013.01);
(Continued)

(58) Field of Classification Search
CPC ......... H01L 29/6681; H01L 21/823431; H01L 21/823481; H01L 27/0886; H01L 29/785; H01L 29/66795
See application file for complete search history.

(56) References Cited

U.S. PATENT DOCUMENTS 8,697,515 B2 * 4/2014 Yin .................. H01L 21/823431
  438/239
9,269,629 B2 * 2/2016 Cheng ............... H01L 21/02238
(Continued)

*Primary Examiner* — Nicholas J Tobergte
(74) *Attorney, Agent, or Firm* — Brinks Gilson & Lione

(57) ABSTRACT

A semiconductor structure and a method for forming same, the forming method including: providing a base, where the base includes a device region for forming devices and isolation regions located on two sides of the device region; patterning the base to form a substrate and fins protruding from the substrate; forming, on two sides of the device region, first dummy fins protruding from the substrate of the isolation region; and forming an isolation layer on the substrate exposed by the fins and the first dummy fins, where the isolation layer covers a part of side walls of the fin. In some implementations of the present disclosure, the setting of the first dummy fins improves the uniformity of pattern density in peripheral regions for each fin, which is advantageous for improving the thickness uniformity of an isolation layer in the device region, reducing the probability that the fin is bent or tilted, and improving electrical properties of the semiconductor structure.

15 Claims, 6 Drawing Sheets

(51) Int. Cl.
*H01L 27/088* (2006.01)
*H01L 29/78* (2006.01)
*H01L 21/02* (2006.01)

(52) U.S. Cl.
CPC .... *H01L 21/0262* (2013.01); *H01L 21/02527* (2013.01); *H01L 21/02532* (2013.01); *H01L 21/02592* (2013.01); *H01L 21/823431* (2013.01); *H01L 21/823481* (2013.01); *H01L 27/0886* (2013.01); *H01L 29/785* (2013.01)

(56) References Cited

U.S. PATENT DOCUMENTS

| | | | |
|---|---|---|---|
| 9,799,570 B1 * | 10/2017 | Cheng | H01L 21/823807 |
| 10,497,799 B2 * | 12/2019 | Cheng | H01L 27/1211 |
| 10,699,939 B2 * | 6/2020 | Hu | H01L 21/76232 |

* cited by examiner

SEMICONDUCTOR STRUCTURE AND METHOD FOR THE FORMING SAME

RELATED APPLICATIONS

The present application claims priority to Chinese Patent Appln. No. 201811605465.4, filed Dec. 26, 2018, the entire disclosure of which is hereby incorporated by reference.

BACKGROUND

Technical Field

Embodiments and implementations of the present disclosure relate to the field of semiconductor manufacturing, and in particular, to a semiconductor structure and a method for forming same.

Related Art

In the field of semiconductor manufacturing, with the development trend of very-large-scale integrated circuits, a critical dimension of an integrated circuit has continually become smaller. In order to adapt to smaller critical dimensions, a channel length of a metal-oxide-semiconductor field-effect transistor (MOSFET) has correspondingly also continually shortened. However, as the length of channels of a device shortens, a distance between a source electrode and a drain electrode of the device is accordingly shortened, and therefore, a channel controlling capability of the gate electrode also deteriorates, and a difficulty in pinching the channels off by a gate voltage also becomes continually larger, so that a phenomenon of sub-threshold leakage, that is, the so-called short-channel effect (SCE), may more easily to occur.

Therefore, in order to better adapt to reduction in the critical dimension, the semiconductor process gradually transits from a planar MOSFET to a three-dimensional transistor with higher efficacy, such as a fin field effect transistor (FinFET). In the FinFET, a gate structure may at least control an ultra-thin body (a fin) from two sides. Compared with the planar MOSFET, the gate structure has a stronger channel controlling capability and can better suppress the short-channel effect. Moreover, compared with other devices, the FinFET has better compatibility with current integrated circuit manufacturing.

When the trend of the forward extending of the Moore's law is irreversible, the self-aligned double patterning (SADP) technology and the self-aligned quadruple patterning (SQDP) technology are applied to a process for forming the FinFET, and a fin cut last procedure is also an indispensable process step in the process for forming the FinFET.

SUMMARY

A problem addressed by embodiments and implementations of the present disclosure is to provide a semiconductor structure and a method for forming same, so as to optimize performance of the semiconductor structure.

To address the foregoing problem, one form of the present disclosure provides a method for forming a semiconductor structure. The method may include: providing a base, where the base includes a device region for forming devices and isolation regions located on two sides of the device region; patterning the base to form a substrate and fins protruding from the substrate; forming, on two sides of the device region, first dummy fins protruding from the substrate of the isolation region; and forming an isolation layer on the substrate exposed by the fins and the first dummy fins, where the isolation layer covers a part of side walls of the fin.

In some implementations, in the step of forming the first dummy fins, along a direction perpendicular to side walls of the first dummy fin, a distance between the first dummy fin and an adjacent fin is a first distance, and a distance between adjacent fins on the device region is a second distance, where the first distance is greater than 0.5 times the second distance and less than 3 times the second distance.

In some implementations, the step of forming the first dummy fins includes: forming a sacrificial layer covering the fins in the device region, where the sacrificial layer exposes the substrate of the isolation region; and forming first dummy fins on side walls of the sacrificial layer; and after forming the first dummy fins, the forming method further includes: removing the sacrificial layer.

In some implementations, the step of forming the sacrificial layer comprises: forming a sacrificial material layer on the substrate exposed by the fin, wherein the sacrificial material layer covers the top and the side walls of the fin in a conformal manner; and removing the sacrificial material layer on the top of the fin and on the substrate of the isolation region and retaining the remaining sacrificial material layer as the sacrificial layer.

In some implementations, in the step of forming the sacrificial layer, along a direction perpendicular to the side walls of the fin, a width of the sacrificial material layer is greater than 0.5 times a distance between adjacent fins and less than 3 times the distance between adjacent fins.

In some implementations, the step of forming first dummy fins on side walls of the sacrificial layer includes: forming a dummy fin material layer covering the top and the side walls of the sacrificial layer in a conformal manner; and removing the dummy fin material layer on the top of the sacrificial layer and retaining the dummy fin material layer on the side walls of the sacrificial layer as the first dummy fin.

In some implementations, the dummy fin material layer is formed using an atom layer deposition process or a chemical vapor deposition process.

In some implementations, the sacrificial layer is formed using the atom layer deposition process or the chemical vapor deposition process.

In some implementations, a material of the sacrificial layer is amorphous carbon or amorphous germanium.

In some implementations, the material of the sacrificial layer is amorphous carbon and a process for removing the sacrificial layer is an oxidization process; or, the material of the sacrificial layer is amorphous germanium and the process for removing the sacrificial layer is a wet etch process.

In some implementations, the wet etch process is performed by using HCl vapor.

In some implementations, in the step of forming the first dummy fins, along the direction perpendicular to the side walls of the first dummy fin, a width of the first dummy fin is 1 time to 3 times a width of the fin.

In some implementations, in the step of forming the first dummy fins, a top of the first dummy fin is flush with a top of the fin.

In some implementations, in the step of forming the first dummy fins, a material of the first dummy fin is an insulating material.

In some implementations, in the step of patterning the base, a fin mask film layer is formed on the top of the fin; in the step of forming the first dummy fins, the material of the first dummy fin is the same as a material of the fin mask film layer; and after forming the isolation layer, the forming method further includes: removing the fin mask film layer and partial thickness of the first dummy fin.

In some implementations, in the step of forming the first dummy fins, the material of the first dummy fin is silicon nitride, silicon oxynitride or silicon carbide.

Another form of the present disclosure provides a semiconductor structure. The semiconductor structure may include: a substrate, where the substrate includes a device region for forming devices and isolation regions located on two sides of the device region; fins protruding from the substrate of the device region; first dummy fins located on two sides of the device region and protruding from the substrate of the isolation region; and an isolation layer located on the substrate exposed by the fins and the first dummy fins, where the isolation layer covers a part of side walls of the fin.

In some implementations, along a direction perpendicular to side walls of the first dummy fin, the distance between the first dummy fin and an adjacent fin is a first distance, and the distance between adjacent fins on the device region is a second distance, wherein the first distance is greater than 0.5 times the second distance and less than 3 times the second distance.

In some implementations, a material of the first dummy fin is an insulating material.

In some implementations, the material of the first dummy fin is silicon nitride, silicon oxynitride or silicon carbide.

In some implementations, along the direction perpendicular to the side walls of the first dummy fin, the width of the first dummy fin is 1 time to 3 times the width of the fin.

Compared with the prior art, technical solutions of some implementations of the present disclosure have the following advantages:

In some implementations of the present disclosure, first dummy fins protruding from the substrate of the isolation region are formed on two sides of the device region. The setting of the first dummy fins improves the uniformity of pattern density in peripheral regions for each fin, which is advantageous for improving the thickness uniformity of an isolation layer in the device region. Moreover, during forming of the isolation layer, it is advantageous for avoiding poor uniformity of stress applied to the fin caused by the inconsistency in pattern density in peripheral regions for each fin, thus reducing the probability that the fins in the device region are bent or tilted, and improving electrical properties of the semiconductor structure.

In some implementations, the step of forming first dummy fins includes: forming a dummy fin material layer covering the top and the side walls of the sacrificial layer in a conformal manner, the dummy fin material layer on the top of the sacrificial layer may be removed subsequently by using a mask film-free etch process, and the dummy fin material layer on the side walls of the sacrificial layer is retained as the first dummy fin, which is advantageous for simplifying process procedures. Moreover, masks are not required for the step of forming the first dummy fins, thereby reducing the process cost.

In some implementations, the step of forming the sacrificial layer includes: forming a sacrificial material layer on the substrate exposed by the fin, where the sacrificial material layer covers the top and the side walls of the fin in a conformal manner, the sacrificial material layer on the top of the fin and on the substrate of the isolation region may be removed subsequently using the mask film-free etch process, and the remaining sacrificial material layer is retained as the sacrificial layer. The process procedures are simple, the process compatibility is high, and masks are not required for the step of forming the sacrificial layer, thereby further reducing the process cost.

BRIEF DESCRIPTION OF THE DRAWINGS

The accompanying drawings constitute a part of this specification, describe exemplary embodiments and implementations of the present disclosure, and are used to explain the principles of the present disclosure together with this specification. In the accompanying drawings.

DETAILED DESCRIPTION

Referring to FIG. 1 to FIG. 5, schematic structural diagrams corresponding to steps of one form of a method for forming a semiconductor structure are shown.

Figure 1:
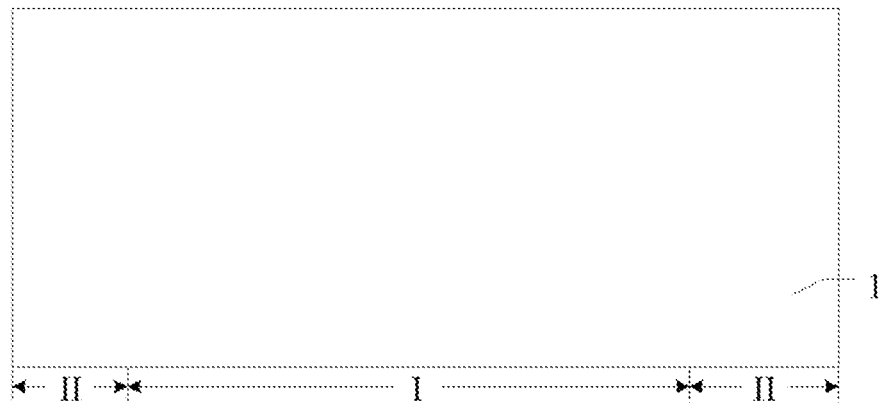
FIG. 1 to FIG. 5 are schematic structural diagrams corresponding to steps of one form of a method for forming a semiconductor structure.

Referring to FIG. 1, a base 1 is provided. The base 1 includes a device region I for forming devices and isolation regions II located on two sides of the device region I.

Figure 2:
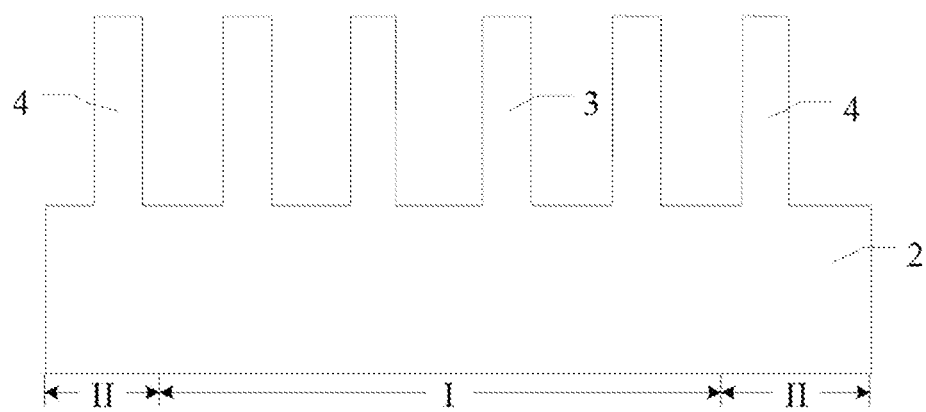

Referring to FIG. 2, the base 1 is patterned to form a substrate 2 and fins 3 protruding from the substrate 2, and the fin 3 located in the isolation region II are used as a dummy fin 4.

Figure 3:
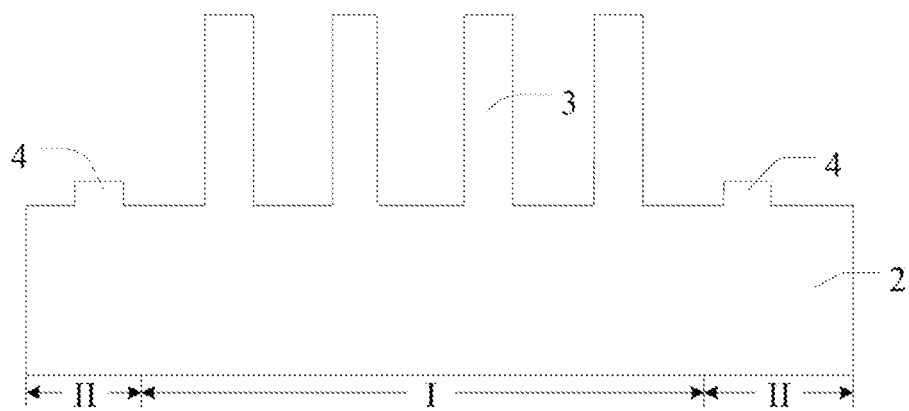

Referring to FIG. 3, after the base 1 is patterned, the dummy fin 4 is etched.

Figure 4:
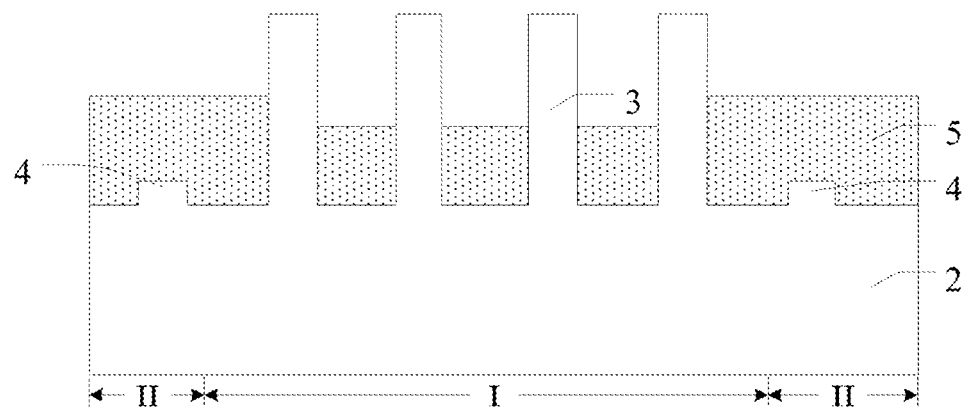
Figure 5:
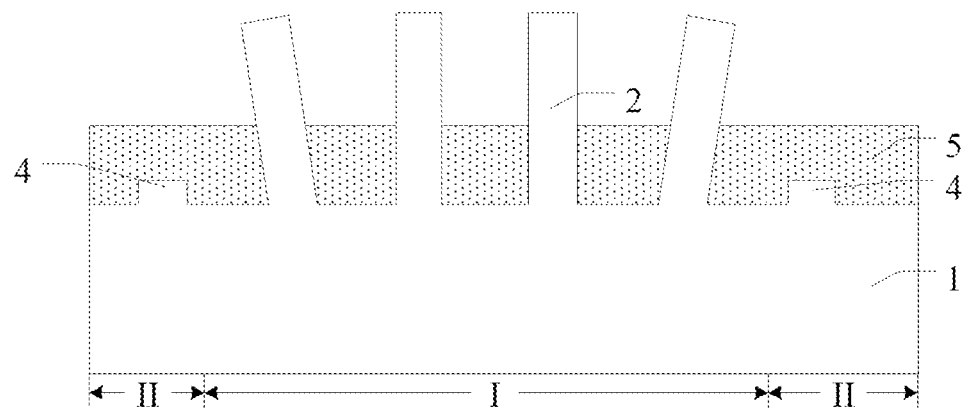

Referring to FIG. 4 and FIG. 5 in combination, an isolation layer 5 is formed on the substrate 2 exposed by the fins 3 and the dummy fins 4. The isolation layer 5 covers a part of side walls of the fin 3.

In the forming method, after the dummy fin 4 is etched, the uniformity of pattern density around each fin 3 in the device region I is poor, especially the fin located at an edge of the device region I. Therefore, it may easily result in poor thickness uniformity of the isolation layer 5 during forming the isolation layer 5. Specifically, referring to FIG. 4 in combination, FIG. 4 shows the event that the thickness of the isolation layer 5 located in the isolation region II is greater than the thickness of the isolation layer 5 located in the device region I.

Or, referring to FIG. 5 in combination, since the uniformity of pattern density around each fin 3 in the device region I is poor, during forming the isolation layer 5, the stress applied to each fin 3 of the device region I is inconsistent, which may easily result in bending or tilting of the fin 3 in the device region I and thus may easily improve the probability that variability occurs to the semiconductor structure, thereby resulting in poor semiconductor structure electrical properties.

In order to address the technical problems described above, the present disclosure provides a method for forming a semiconductor structure. One form of the method includes: providing a base, where the base includes a device region for forming devices and isolation regions located on two sides of the device region; patterning the base to form a substrate and fins protruding from the substrate; forming, on two sides of the device region, first dummy fins protruding from the substrate of the isolation region; and forming an isolation layer on the substrate exposed by the fins and the first dummy fins, where the isolation layer covers a part of side walls of the fin.

In some implementations of the present disclosure, first dummy fins protruding from the substrate of the isolation region are formed on two sides of the device region. The setting of the first dummy fins improves the uniformity of pattern density in peripheral regions for each fin, which is advantageous for improving the thickness uniformity of an isolation layer in the device region. Moreover, during forming the isolation layer, it is advantageous for avoiding poor uniformity of stress applied to the fin caused by the inconsistency in pattern density in peripheral regions for each fin, thus reducing the probability that the fins in the device region are bent or tilted, and improving electrical properties of the semiconductor structure.

To make the foregoing objectives, features and advantages of some implementations of the present disclosure easier to understand, specific embodiments and implementations of the present disclosure are described in detail below with reference to the accompanying drawings.

FIG. 6 to FIG. 14 are schematic structural diagrams corresponding to steps in one form of a method for forming a semiconductor structure according to the present disclosure.

Figure 6:
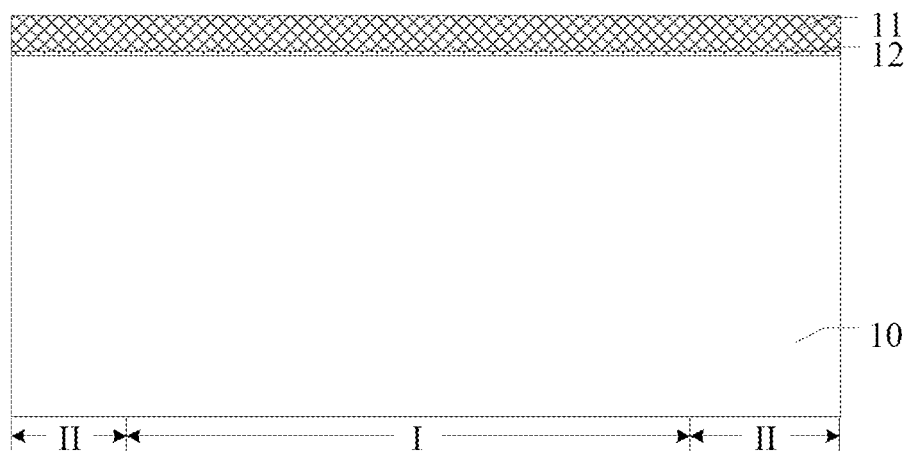
FIG. 6 to FIG. 14 are schematic structural diagrams corresponding to steps in one form of a method for forming a semiconductor structure according to the present disclosure.

Referring to FIG. 6, a base 10 is provided. The base 10 includes a device region I for forming devices and isolation regions II located on two sides of the device region.

The base 10 is used for subsequently forming a substrate and fins protruding from the substrate, and the base 10 is further used for providing a process platform for forming a semiconductor structure subsequently.

In some implementations, the base 10 is of an integrated structure, which is advantageous for simplifying process procedures. In other implementations, the base may further include a first semiconductor material layer and a second semiconductor material layer located on the first semiconductor material layer, thereby achieving an objective of precisely controlling the height of fin formed.

In some implementations, a material of the base 10 is silicon. In other implementations, the material of the base may also be germanium, silicon germanide, silicon carbide, gallium arsenide, indium gallide or the like. The base may also be other types of bases such as a silicon base on an insulator or a germanium base on an insulator. The material of the base may be a material suitable for process requirements or easy to be integrated.

In some implementations, a fin mask film material layer 11 is further formed on the top of the base 10. The fin mask film material layer 11 is used for forming, via a subsequent process, a fin mask film layer patterning the base 10. In some implementations, a material of the fin mask film material layer 11 is silicon nitride.

The silicon nitride material has relatively large stress when heated. Therefore, in some implementations, a stress buffering material layer 12 is further formed between the fin mask film material layer 11 and the base 10, and the stress buffering material layer 12 is used for functioning in stress buffering, which is advantageous for improving the adhesiveness between the fin mask film material layer 11 and the base 10, thereby improving the adhesiveness between a subsequent fin mask film layer and the fin correspondingly. In some implementations, a material of the stress buffering material layer 12 is silicon oxide.

Figure 7:
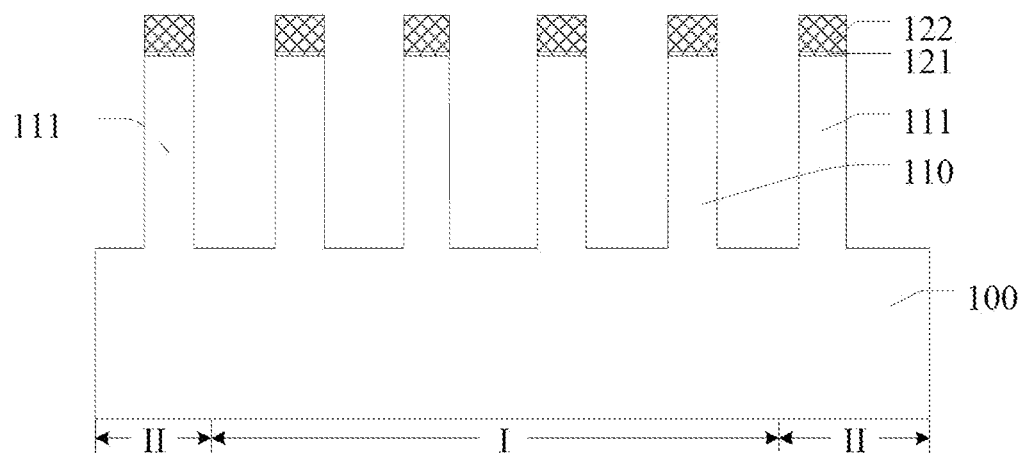
Figure 8:
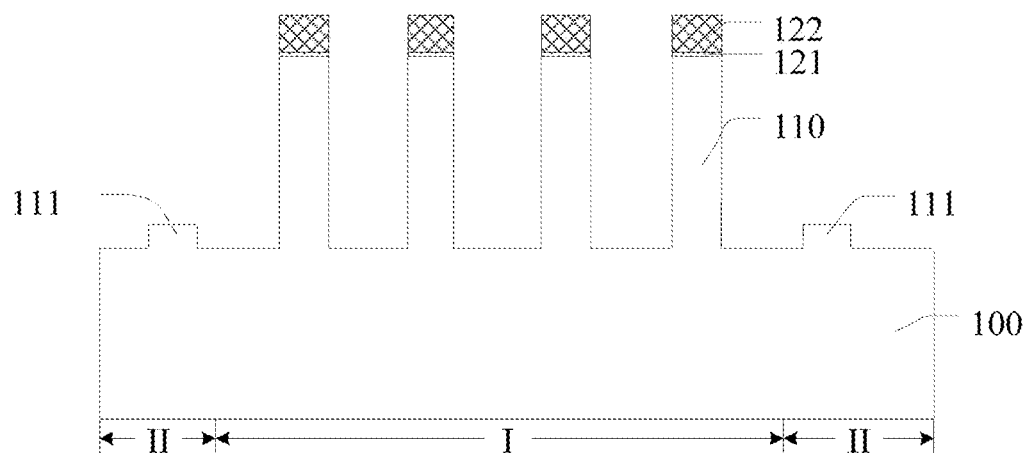

Referring to FIG. 7 to FIG. 8, the base 10 (as shown in FIG. 6) is patterned to form a substrate 100 and fins 110 protruding from the substrate 100.

The substrate 100 is used for providing a process platform for forming a semiconductor structure subsequently.

In some implementations, the substrate 100 is a silicon substrate. In other implementations, a material of the substrate may also be germanium, silicon germanide, silicon carbide, gallium arsenide, indium gallide or the like. The substrate may also be other types of substrates such as a silicon substrate on an insulator or a germanium substrate on an insulator.

The fin 110 is used for providing a channel of a fin field effect transistor subsequently.

In some implementations, the fin 110 and the substrate 100 are obtained by etching the same semiconductor material layer. In other implementations, the fin may also be a semiconductor layer epitaxially grown on the substrate, thereby achieving an objective of controlling the height of the fin precisely.

Therefore, in some implementations, a material of the fin 110 is the same as the material of the substrate 100, and the material of the fin 110 is silicon. In other implementations, the material of the fin may also be germanium, silicon germanide, silicon carbide, gallium arsenide or indium gallide.

In some implementations, the base 10 is patterned by the self-aligned double patterning (SADP) technology or the self-aligned quadruple patterning (SQDP) technology, which is advantageous for improving the pattern density and precision of the fin 110 and implementing smaller periodic pattern imaging.

In some implementations, a stress buffering material layer 12 (as shown in FIG. 6) and a fin mask film material layer 11 (as shown in FIG. 6) are further formed on the top of the base 10. Therefore, before patterning the base 10, the forming method further includes: patterning the fin mask film material layer 11 and the stress buffering material layer 12 to form a fin mask film layer 122 and a stress buffering layer 121.

The fin mask film layer 122 is used as an etch mask film for forming the fin 110 and the substrate 100, and the fin mask film layer 122 may also protect the top of the fin 110 in subsequent process procedures. The stress buffering layer 121 is located between the fin mask film layer 122 and the fin 110, thereby functioning in stress buffering, which improves the adhesiveness between the fin mask film layer 122 and the fin 110.

Correspondingly, in the step of patterning the base 10, the base 10 is patterned by using the fin mask film layer 122 as a mask film, so as to form a substrate 100 and fins 110 protruding from the substrate 100.

It should be noted that referring to FIG. 7, in some implementations, in the step of patterning the base 10, the base 10 of the isolation region II is also patterned, and therefore, the fin 110 is further formed on the substrate 100 of the isolation region II.

In some implementations, the fin 110 located in the isolation region II is used as a second dummy fin 111. The base 10 of the device region I and the isolation region II is patterned in the same step, which is advantageous for improving the size consistency and morphology uniformity of the fin 110. In other implementations, in the step of patterning the base, with the fin mask film layer protruding from the whole base of the isolation region, a fin may be prevented from forming on the isolation region, that is, a second dummy fin is not formed on the substrate of the isolation region.

Therefore, as shown in FIG. 8, in some implementations, after the base 10 is patterned, the forming method further includes: etching the second dummy fin 111.

With the second dummy fin 111 etched, the second dummy fin 111 is prevented from impacting subsequent process procedures, the second dummy fin 111 is prevented from being used for forming devices, and the occurrence of leakage current and parasitic capacitance in the second dummy fin 111 subsequently is avoided.

It should be noted that etching the second dummy fin 111 belongs to a fin cut last process commonly used in the field of semiconductors, and is advantageous for reducing difficulty in process operation and improving process compatibility.

It should be further noted that in the step of etching the second dummy fin 111, merely partial thickness of the second dummy fin 111 is removed, and therefore, a remaining second dummy fin 111 is still on the substrate 100 of the isolation region II.

Figure 9:
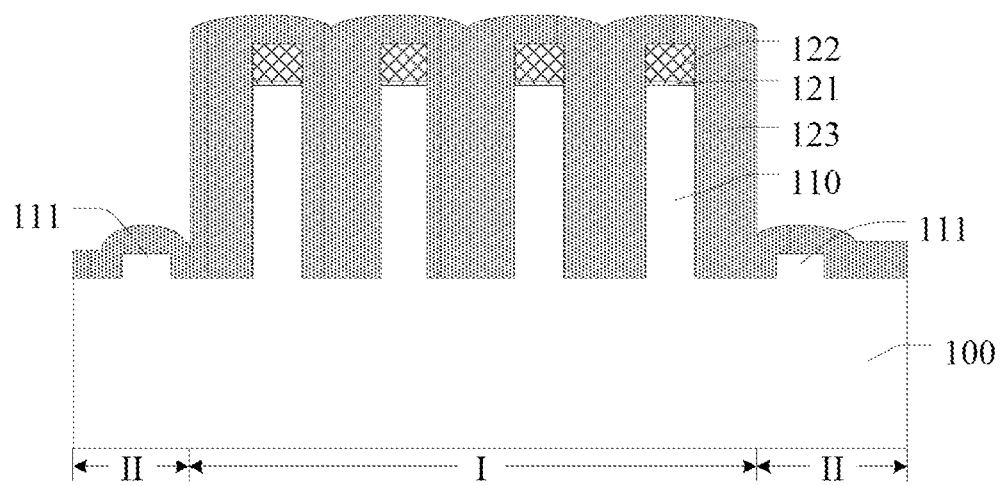
Figure 10:
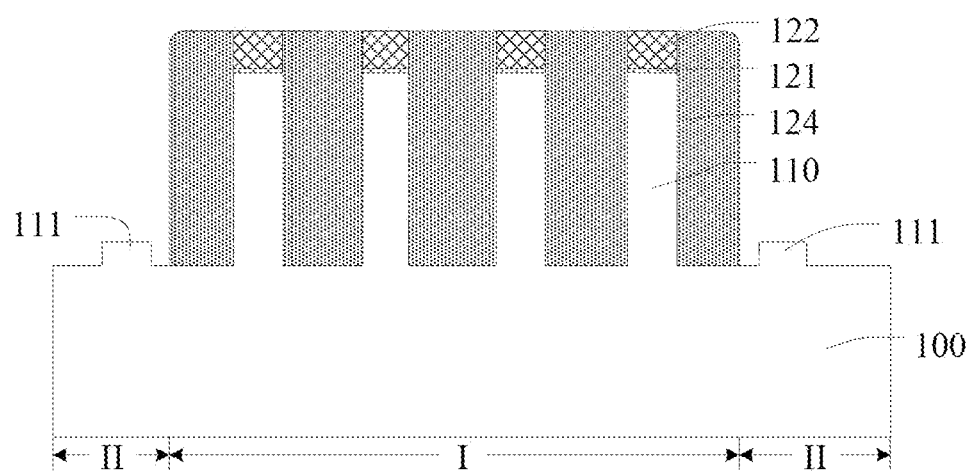
Figure 11:
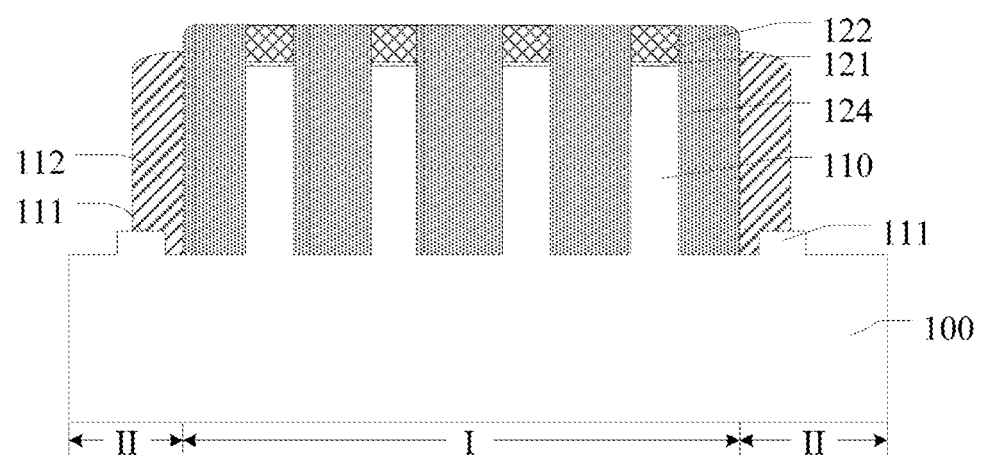

Referring to FIG. 9 to FIG. 12, first dummy fins 112 (as shown in FIG. 11) protruding from the substrate 100 of the isolation region II are formed on two sides of the device region I.

The setting of the first dummy fins 112 may improve the uniformity of pattern density in peripheral regions for each fin 110, which is advantageous for improving the thickness uniformity of an isolation layer in the device region I. Moreover, during forming the isolation layer, it is advantageous for avoiding poor uniformity of stress applied to the fin 110 caused by the inconsistency in pattern density in peripheral regions for each fin 110, thus reducing the probability that the fins 110 of the device region I are bent or tilted and improving the electrical properties of the semiconductor structure.

In some implementations, a material of the first dummy fin 112 is an insulating material. With the material of the first dummy fin 112 being an insulating material, it is advantageous for reducing the impact of the first dummy fin 112 on the electrical properties of the semiconductor structure as well as subsequent process procedures. After the isolation layer is formed subsequently, the first dummy fin 112 may not be removed, which is advantageous for improving the process compatibility and simplifying the process procedures.

Specifically, the material of the first dummy fin 112 may be silicon nitride, silicon oxynitride or silicon carbide.

In some implementations, the material of the first dummy fin 112 is the same as a material of the fin mask film layer 122. The material of the fin mask film layer 122 is silicon nitride, and the material of the first dummy fin 112 is silicon nitride correspondingly. With the material of the first dummy fin 112 being the same as the material of the fin mask film layer 122, in a subsequent step of removing the fin mask film layer 122, partial thickness of the first dummy fin 112 may also be removed, which is advantageous for simplifying the process procedures and is also advantageous for further reducing the impact of the first dummy fin 112 on the electrical properties of the semiconductor structure and subsequent process procedures.

It should be noted that along a direction perpendicular to side walls of the first dummy fin 112, the distance between the first dummy fin 112 and an adjacent fin 110 should not be too small or too large, otherwise, it may easily reduce the effect of the first dummy fin 112 for improving the uniformity of pattern density in peripheral regions for the fin 110. Therefore, along the direction perpendicular to the side walls of the first dummy fin 112, the distance between the first dummy fin 112 and an adjacent fin 110 is a first distance, and the distance between adjacent fins 110 on the device region I is a second distance, where the first distance is greater than 0.5 times the second distance and less than 3 times the second distance. Specifically, the first distance may be equal to the second distance, so that the effect of the first dummy fin 112 for improving the uniformity of pattern density in peripheral regions for the fin 110 is more significant, and correspondingly, it is advantageous for further improving the thickness uniformity of an isolation layer in the device region I subsequently.

It should be further noted that along the direction perpendicular to the side walls of the first dummy fin 112, the width of the first dummy fin 112 should not be too small or too large. Since the uniformity of pattern density in peripheral regions for the first dummy fin 112 is relatively low, in the step of forming the isolation layer subsequently, the uniformity of stress applied to the first dummy fin 112 is relatively poor. If the width of the first dummy fin 112 is too small, the mechanical strength of the first dummy fin 112 may be too small correspondingly, and the probability that the first dummy fin 112 is tilted or bent in the step of forming the isolation layer may relatively high, which may have an adverse effect on the performance of the semiconductor structure easily. If the width of the first dummy fin 112 is too large, the area occupied by the first dummy fin 112 may be too large, which may increase the chip area occupied by the semiconductor structure easily. To this end, in some implementations, the width of the first dummy fin 112 is 1 time to 3 times the width of the fin 110. Specifically, the width of the first dummy fin 112 may be the same as the width of the fin 110, thereby improving the uniformity of pattern density in peripheral regions for the fin 110.

Specifically, the step of forming the first dummy fin 112 is described in detail below in combination with the accompanying drawings:

Referring to FIG. 9 to FIG. 10 in combination, a sacrificial layer 124 covering the fins 110 in the device region I is formed. The sacrificial layer 124 exposes the substrate 100 of the isolation region I.

The sacrificial layer 124 is used for providing a process platform for forming a first dummy fin. Specifically, the first dummy fins are formed on side walls of the sacrificial layer 124. Moreover, the sacrificial layer 124 exposes the substrate 100 of the isolation region I, thereby providing a process foundation for the first dummy fin to be formed on the isolation region I subsequently.

In order to reduce the impact of the sacrificial layer 124 on subsequent process procedures, in some implementations, the sacrificial layer 124 is of a material easy to be removed.

Specifically, a material of the sacrificial layer 124 may be amorphous carbon or amorphous germanium. In some implementations, the material of the sacrificial layer 124 is amorphous carbon.

The amorphous carbon is a material easy to be obtained, which is advantageous for reducing the process cost of forming the sacrificial layer 124. Moreover, the amorphous carbon may be removed subsequently by an oxidization process, which is advantageous for reducing the difficulty of process operations for removing the sacrificial layer 124 subsequently and also advantageous for reducing the impact of the sacrificial layer 124 on subsequent process procedures and the semiconductor structure.

In some implementations, the step of forming the sacrificial layer 124 includes: forming a sacrificial material layer 123 (as shown in FIG. 9) on the substrate 100 exposed by the fin 110, where the sacrificial material layer 123 covers the top and the side walls of the fin 110 in a conformal manner; and removing the sacrificial material layer 123 on the top of the fin 110 and on the substrate of the isolation region I and retaining the remaining sacrificial material layer 123 as the sacrificial layer (as shown in FIG. 10).

With the sacrificial material layer 123 covering the top and the side walls of the fin 110 in a conformal manner, the sacrificial material layer 123 on the top of the fin 110 and on the substrate 100 of the isolation region II may be removed subsequently by using a mask film-free etch process, and the remaining sacrificial material layer 123 is retained as the sacrificial layer 124. The process procedures are simple, the process compatibility is high, and masks are not required for the step of forming the sacrificial layer 124, thereby further reducing the process cost.

In other implementations, according to actual process requirements, the sacrificial material layer also may not cover the top and the side walls of the fin in a conformal manner. The step of forming the sacrificial layer correspondingly includes: forming a sacrificial material layer on the substrate exposed by the fin, where the sacrificial material layer covers the top of the fin; forming a mask film layer covering the top of the sacrificial layer in the device region; and removing the sacrificial material layer on the substrate of the isolation region by using the mask film layer as a mask film, and retaining the remaining sacrificial material layer as the sacrificial layer. With etching performed by using the mask film, it is advantageous for precisely controlling regions for forming the sacrificial layer, and further precisely controlling the distance between a second dummy fin formed on side walls of the sacrificial layer subsequently and an adjacent fin.

In some implementations, the sacrificial material layer 123 is formed by using an atom layer deposition (ALD) process. The atom layer deposition process includes performing a plurality of atom layer deposition circulation to form the sacrificial layer 123 with required thickness. With use of the atomic layer deposition process, it is advantageous for improving the thickness uniformity of the sacrificial material layer 123, so that the thickness of the sacrificial layer 123 may be controlled precisely. Furthermore, the atom layer deposition process has good gap filling performance and stepped covering property, which improves a conformal covering capability of the sacrificial material layer 123 correspondingly, thereby improving a covering capability of the sacrificial material layer 123 for the top and the side walls of the fin 110. In other implementations, the sacrificial material layer may also be formed by using a chemical vapor deposition process.

In some implementations, a remaining second dummy fin 111 is further formed on the substrate 100 of the isolation region II. Therefore, in the step of forming the sacrificial material layer 123, the sacrificial material layer 123 further covers the top and side walls of the remaining second dummy fin 111.

It should be noted that in the step of forming the sacrificial material layer 123, along a direction perpendicular to the side walls of the fin 110, the width of the sacrificial material layer 123 should not be too small or too large. With the sacrificial material layer 123 covering the top and the side walls of the fin 110 in a conformal manner, if the width of the sacrificial material layer 123 is too small, it may easily result in a gap between adjacent fins 110 being difficult to be filled up by the sacrificial material layer 123 and thus easily result in a material of a subsequent first dummy fin being filled into the gap, thereby having an adverse effect on process procedures such as removing the sacrificial layer 124 and forming the isolation layer. Moreover, too small a width of the sacrificial material layer 123 may easily result in too small distance between the subsequent first dummy fin and an adjacent fin 110, thereby reducing the effect of the first dummy fin for improving the uniformity of pattern density in peripheral regions for each fin 110. If the width of the sacrificial material layer 123 is too large, it may easily result in too large distance between the first dummy fin and an adjacent fin 110 and may also easily increase the difficulty in removing the sacrificial material layer 123 on the top of the fin 110 and on the substrate 100 of the isolation region II subsequently. To this end, in some implementations, the width of the sacrificial material layer 123 is greater than 0.5 times the distance between adjacent fins 110 and less than 3 times the distance between adjacent fins 110.

In some implementations, the sacrificial material layer 123 on the top of the fin 110 and on the substrate 100 of the isolation region II is removed by using a dry etch process. With use of dry etching, the proportion of transverse etching to longitudinal etching may be controlled, so that the anisotropy of an etch process is improved, and the cross section etching controllability is better. Moreover, during removing the sacrificial material layer 123 on the top of the fin 110 and on the substrate 100 of the isolation region II, it is advantageous for reducing the impact on the sacrificial material layer 123 on the side walls of the fin 110, thereby improving the smoothness and perpendicularity of side walls of the sacrificial layer 124, which is thus advantageous for improving the quality of the first dummy fin 112 formed on the side walls of the sacrificial layer 124 subsequently.

In some implementations, the sacrificial material layer 123 covers the top and the side walls of the fin 110 and the substrate 100 of the isolation region I in a conformal manner. Therefore, the width of the sacrificial material layer 123 on the top of the fin 110 and that on the substrate 100 of the isolation region I are the same, thereby ensuring that the sacrificial material layer 123 on the substrate 100 of the isolation region I may be removed completely while removing the sacrificial material layer 123 on the top of the fin 110.

In some implementations, a fin mask film layer 122 is formed on the top of the fin 110. Correspondingly, after forming the sacrificial layer 124, the top of the sacrificial layer 124 is flush with the top of the fin mask film layer 122.

In some implementations, the sacrificial material layer 123 further covers the top and side walls of the remaining second dummy fin 111 in a conformal manner, and the width of the sacrificial material layer 123 is relatively small. Therefore, in the step of removing the sacrificial material layer 123 on the top of the fin 110 and on the substrate 100 of the isolation region II, the sacrificial material layer 123 both on the top and on the side walls of the second dummy fin 111 may be removed.

Referring to FIG. 11, first dummy fins 112 are formed on side walls of the sacrificial layer 124.

With the first dummy fins 112 formed on the side walls of the sacrificial layer 124, it is advantageous for reducing process difficulty and improving process manufacturing efficiency.

In some implementations, the step of forming first dummy fins 112 on side walls of the sacrificial layer 124 includes: forming a dummy fin material layer (not shown) covering the top and the side walls of the sacrificial layer 124 in a conformal manner; and removing the dummy fin material layer on the top of the sacrificial layer 124 and retaining the dummy fin material layer on the side walls of the sacrificial layer 124 as the first dummy fin 112.

In some implementations, the dummy fin material layer covers the top and the side walls of the sacrificial layer 124 in a conformal manner. Therefore, the dummy fin material layer on the top of the sacrificial layer 124 may be removed subsequently by using a mask film-free etch process, which is advantageous for simplifying process procedures. Moreover, masks are not required for the step of forming the first dummy fins 112, thereby reducing the process cost.

In other implementations, according to actual process requirements, the dummy fin material layer also may not cover the top and the side walls of the sacrificial layer in a conformal manner. The step of forming the first dummy fins correspondingly includes: forming a dummy fin material layer on the substrate exposed by the sacrificial layer, where the dummy fin material layer covers the sacrificial layer; after removing partial thickness of the dummy fin material layer, forming a dummy fin mask film layer on the top, which is close to one side of the sacrificial layer, of the remaining dummy fin material layer; and removing a part of the dummy fin material layer on the substrate of the isolation region using the dummy fin mask film layer as a mask film, and retaining a part of the dummy fin material layer on the side walls of the sacrificial layer as the first dummy fin. With etching performed using the mask film, it is advantageous for controlling the width of the first dummy fin precisely.

In some implementations, the dummy fin material layer is formed using an atom layer deposition process. A thin film formed by the atom layer deposition process has high quality and good thickness uniformity, and is correspondingly advantageous for improving the quality of the first dummy fin 112 formed. Moreover, the atom layer deposition process has good gap filling performance and stepped covering property, thereby improving a conformal covering capability of the dummy fin material layer correspondingly. In other implementations, the dummy fin material layer may also be formed by using a chemical vapor deposition process.

In some implementations, the dummy fin material layer on the top of the sacrificial layer 124 is removed by using a dry etch process. The use of dry etching is advantageous for improving the anisotropy and cross section etching controllability of etching treatment, so that it is advantageous for improving the morphology quality of the first dummy fin 112.

It should be noted that in some implementations, in order to improve the consistency in height of the first dummy fin 112 and the fin 110, the top of the first dummy fin 112 is flush with the top of the fin 110, thereby further improving the deposition uniformity and etching uniformity of a material of the isolation layer in the device region I during forming the isolation layer subsequently, so as to make the effect of improving the consistency in thickness of the isolation layer in the device region I more significant.

Therefore, in some implementations, during removal of the dummy fin material layer on the top of the sacrificial layer 124, over-etch treatment is performed on the dummy fin material layer, thereby removing partial thickness of the dummy fin material layer on side walls of the sacrificial layer 124. Moreover, by performing over-etch treatment on the dummy fin material layer, it is ensured that the dummy fin material layer on the top of the sacrificial layer 124 is removed completely, so as to reduce the impact on a process for removing the sacrificial layer 124 subsequently.

In some implementations, a remaining second dummy fin 111 is further formed on the substrate 100 of the isolation region II. Therefore, in the step of forming the first dummy fin 112, the first dummy fin 112 is formed on the second dummy fin 111. In other implementations, according to the distance between the first dummy fin and an adjacent fin and the width of the first dummy fin, the first dummy fin may also be located on one side of the remaining second dummy fin.

Figure 12:
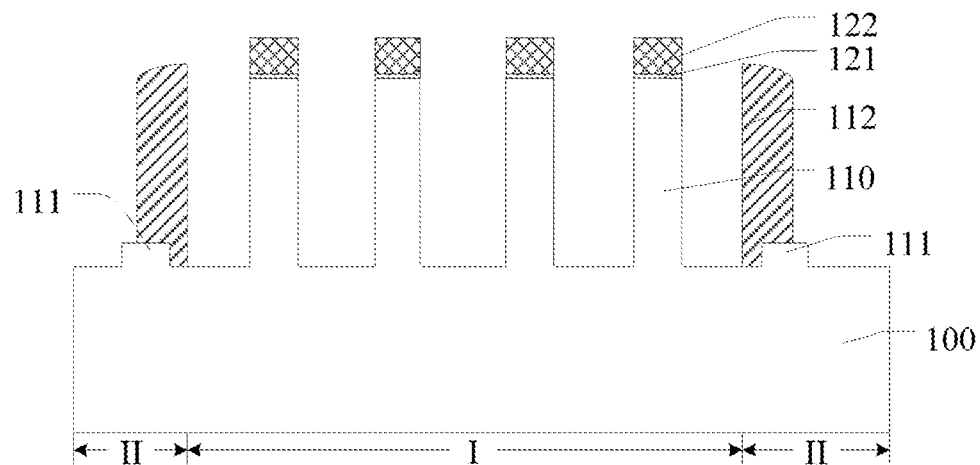

Referring to FIG. 12 in combination, after forming the first dummy fin 112, the forming method further includes: removing the sacrificial layer 124.

The substrate 100 between the fins 110 is exposed by removing the sacrificial layer 124, thereby providing a spatial position for forming an isolation layer subsequently.

In some implementations, the material of the sacrificial layer 124 is amorphous carbon. Therefore, the sacrificial layer 124 is removed using an oxidization process. Oxidizing gas in the oxidization process may be reacted with an amorphous carbon material to generate carbon dioxide gas for expelling from a reaction cavity, the process of removing is simple, the process compatibility is high, side effects are slight, and it is advantageous for reducing the process cost and improving the production capacity.

In other implementations, when the material of the sacrificial layer is amorphous germanium, the sacrificial layer is removed by using a wet etch process. Specifically, the wet etch process is performed by using HCl vapor.

Figure 13:
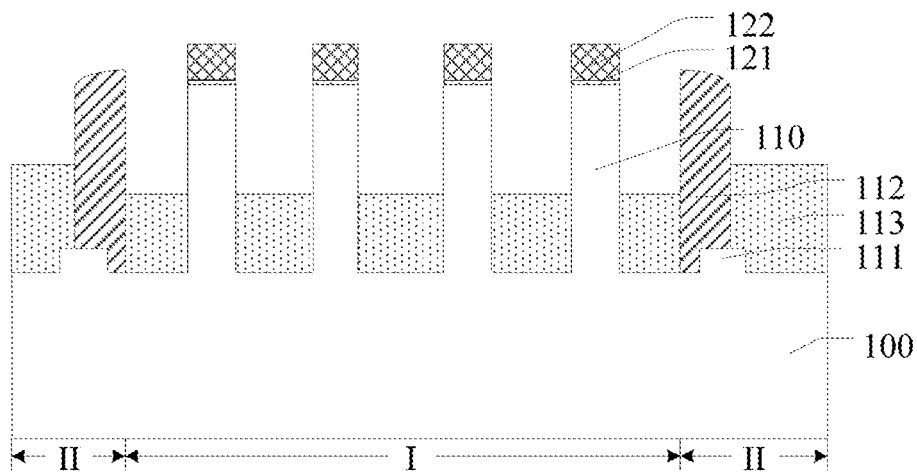

Referring to FIG. 13, an isolation layer 113 is formed on the substrate 100 exposed by the fins 110 and the dummy fins 112. The isolation layer 113 covers a part of side walls of the fin 110.

The setting of the first dummy fins 112 improves the uniformity of pattern density in peripheral regions for each fin 110. Therefore, during forming the isolation layer 113, the uniformity of a deposition rate and an etching rate of a material of the isolation layer 113 in the device region I is better, thereby improving the thickness uniformity of the isolation layer 113 in the device region I and further improving the uniformity of stress applied to each fin 110, so that it is advantageous for reducing the probability that the fins 110 of the device region are bent or tilted during forming the isolation layer 113, and improving the electrical properties of the semiconductor structure.

The isolation layer 113 is used for performing isolation between adjacent devices.

In some implementations, the material of the isolation layer 113 is silicon oxide. Silicon oxide is a dielectric material commonly used in a process and of low cost, has high process compatibility, and is advantageous for reducing the process difficulty and process cost of forming the isolation layer 113. Furthermore, the dielectric constant of silicon oxide is relatively small, which is also advantageous for improving the function of the isolation layer 113 for isolating adjacent devices. In other implementations, the material of the isolation layer may also be another insulating material such as silicon nitride or silicon oxynitride.

Specifically, the step of forming the isolation layer 113 includes: forming an isolation film (not shown) on the substrate 100 exposed by the fin 110 and the first dummy fin 112; removing partial thickness of the isolation film; and retaining the remaining isolation film as the isolation layer 113.

In some implementations, the isolation film is formed using a flowable chemical vapor deposition (FCVD) process. The flowable chemical vapor deposition process has good filling capability, is suitable for filling an opening of a high depth-to-width ratio, is advantageous for reducing the probability that defects such as empty holes are formed in the isolation film, and is correspondingly advantageous for improving the film formation quality of the isolation layer 113.

Figure 14:
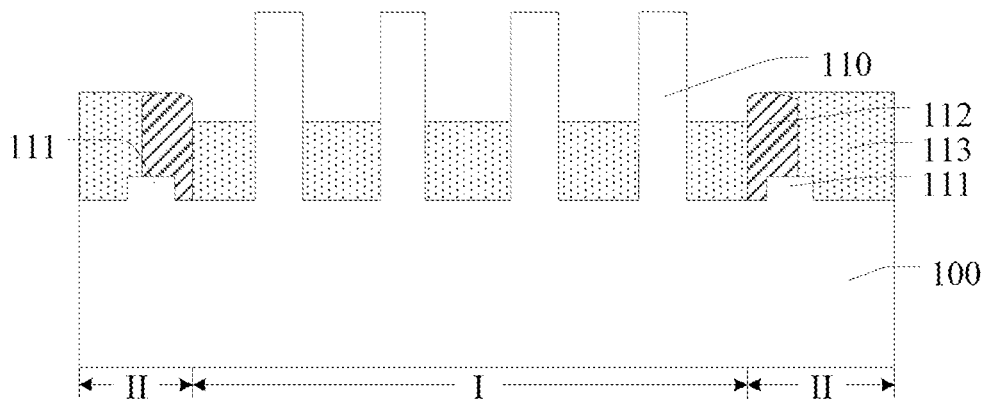

Referring to FIG. 14 in combination, after forming the isolation layer 113, the forming method further includes: removing the fin mask film layer 122 and partial thickness of the first dummy fin 112.

With the fin mask film layer 122 removed, the top of the fin 110 is exposed, thereby providing a process foundation for forming a gate structure across the fin 110 subsequently.

With partial thickness of the first dummy fin 112 removed, the impact of the first dummy fin 112 on subsequent process procedures is further reduced, thereby further improving process compatibility.

In some implementations, a material of the first dummy fin 112 is the same as a material of the fin mask film layer 122, so that partial thickness of the first dummy fin 112 may be removed in the step of removing the fin mask film layer 122.

In some implementations, in the step of removing the fin mask film layer 122, the stress buffering layer 121 (as shown in FIG. 11) located between the fin mask film layer 122 and the fin 110 is also removed.

Correspondingly, the present disclosure further provides a semiconductor structure. Referring to FIG. 14, a schematic structural diagram of an embodiment of a semiconductor structure according to the present disclosure is shown.

The semiconductor structure includes: a substrate 100, where the substrate 100 includes a device region I for forming devices and isolation regions II located on two sides of the device region I; fins 110 protruding from the substrate 100 of the device region I; first dummy fins 112 located on two sides of the device region I and protruding from the substrate 100 of the isolation region II; and an isolation layer 113 located on the substrate 100 exposed by the fins 110 and the first dummy fins 112, where the isolation layer 113 covers a part of side walls of the fin 110.

The setting of the first dummy fins 112 according to some forms of the present disclosure improves the uniformity of pattern density in peripheral regions for each fin 110, which is advantageous for improving the thickness uniformity of an isolation layer 113 in the device region I. Moreover, during forming the isolation layer 113, it is advantageous for avoiding poor uniformity of stress applied to the fin 110 caused by the inconsistency in pattern density in peripheral regions for each fin 110, thus reducing the probability that the fins 110 in the device region I are bent or tilted and improving electrical properties of the semiconductor structure.

The substrate 100 is used for providing a process platform for forming a semiconductor structure.

In some implementations, the substrate 100 is a silicon substrate. In other implementations, a material of the substrate may also be germanium, silicon germanide, silicon carbide, gallium arsenide, indium gallide or the like. The substrate may also be other types of substrates such as a silicon substrate on an insulator or a germanium substrate on an insulator.

In some implementations, the fin 110 and the substrate 100 are obtained by etching the same semiconductor material layer. In other implementations, the fin may also be a semiconductor layer epitaxially grown on the substrate, thereby achieving an objective of controlling the height of the fin precisely.

Therefore, in some implementations, a material of the fin 110 is the same as the material of the substrate 100, and the material of the fin 110 is silicon. In other implementations, the material of the fin may also be germanium, silicon germanide, silicon carbide, gallium arsenide or indium gallide.

In some implementations, the semiconductor structure further includes: a remaining second dummy fin 111 protruding from the substrate 100 of the isolation region I.

Specifically, the remaining second dummy fin 111 may be obtained by the fin cut last process commonly used in the field of semiconductors.

In other implementations, the semiconductor structure may also not include the remaining second dummy fin.

In some implementations, a material of the first dummy fin 112 is an insulating material. With the material of the first dummy fin 112 being an insulating material, it is advantageous for reducing the impact of the first dummy fin 112 on the electrical properties of the semiconductor structure as well as subsequent process procedures, thereby improving the process compatibility of the semiconductor structure.

Specifically, the material of the first dummy fin 112 may be silicon nitride, silicon oxynitride or silicon carbide. In some implementations, the material of the first dummy fin 112 is silicon nitride.

It should be noted that along a direction perpendicular to side walls of the first dummy fin 112, the distance between the first dummy fin 112 and an adjacent fin 110 should not be too small or too large, otherwise, it may easily reduce the effect of the first dummy fin 112 for improving the uniformity of pattern density in peripheral regions for the fin 110. Therefore, along the direction perpendicular to the side walls of the first dummy fin 112, the distance between the first dummy fin 112 and an adjacent fin 110 is a first distance, and the distance between adjacent fins 110 on the device region I is a second distance, where the first distance is greater than 0.5 times the second distance and less than 3 times the second distance. Specifically, the first distance is equal to the second distance, so that the effect of the first dummy fin 112 for improving the uniformity of pattern density in peripheral regions for the fin 110 is more significant, and correspondingly, it is advantageous for further improving the thickness uniformity of an isolation layer in the device region I subsequently.

It should be further noted that along the direction perpendicular to the side walls of the first dummy fin 112, the width of the first dummy fin 112 should not be too small or too large. Since the uniformity of pattern density in peripheral regions for the first dummy fin 112 is relatively low, in the step of forming the isolation layer 113, the uniformity of stress applied to the first dummy fin 112 is relatively poor. If the width of the first dummy fin 112 is too small, the mechanical strength of the first dummy fin 112 may be too small correspondingly, and the probability that the first dummy fin 112 is tilted or bent in the step of forming the isolation layer 113 may be relatively high, which may have an adverse effect on the performance of the semiconductor structure easily. If the width of the first dummy fin 112 is too large, the area occupied by the first dummy fin 112 may be relatively large, which may increase the chip area occupied by the semiconductor structure easily. To this end, in some implementations, the width of the first dummy fin 112 is 1 time to 3 times the width of the fin 110. Specifically, the width of the first dummy fin 112 may be the same as the width of the fin 110, thereby improving the uniformity of pattern density in peripheral regions for the fin 110.

It should be noted that in some implementations, the first dummy fin 112 is located on the remaining second dummy fin 111. In other implementations, according to the distance between the first dummy fin and an adjacent fin and the width of the first dummy fin, the first dummy fin may also be located on one side of the remaining second dummy fin.

The semiconductor structure may be formed using the forming method according to the foregoing embodiments, and may also be formed using other forming methods. For the specific description about the semiconductor structure in some implementations, reference can be made to the corresponding description in the foregoing embodiment, and details are not described again in some implementations.

Although the present disclosure is disclosed as above, it is not limited thereto. Various alterations and modifications may be made by a person skilled in the art without departing from the spirit and scope of the present disclosure, and therefore, with regard to the scope of protection of the present disclosure, the scope defined in the claims shall prevail.

What is claimed is:

1. A method for forming a semiconductor structure, comprising:
    providing a base, wherein the base comprises a device region for forming devices and isolation regions located on two sides of the device region;
    patterning the base to form a substrate and fins protruding from the substrate;
    forming, on two sides of the device region, first dummy fins protruding from the substrate of the isolation region; and
    forming an isolation layer on the substrate exposed by the fins and the first dummy fins, wherein the isolation layer covers a part of side walls of the fin;
    wherein in the step of forming the first dummy fins, along a direction perpendicular to side walls of the first dummy fin, a distance between the first dummy fin and an adjacent fin is a first distance, and a distance between adjacent fins on the device region is a second distance, wherein the first distance is greater than 0.5 times the second distance and less than 3 times the second distance.

2. The method for forming a semiconductor structure according to claim 1, wherein:
    the step of forming the first dummy fins comprises:
        forming a sacrificial layer covering the fins in the device region, wherein the sacrificial layer exposes the substrate of the isolation region; and
        forming first dummy fins on side walls of the sacrificial layer; and
    the method further comprises: after forming the first dummy fins, removing the sacrificial layer.

3. The method for forming a semiconductor structure according to claim 2, wherein the step of forming the sacrificial layer comprises:
    forming a sacrificial material layer on the substrate exposed by the fin, wherein the sacrificial material layer covers a top and the side walls of the fin in a conformal manner; and
    removing the sacrificial material layer on the top of the fin and on the substrate of the isolation region and retaining the remaining sacrificial material layer as the sacrificial layer.

4. The method for forming a semiconductor structure according to claim 3, wherein in the step of forming the sacrificial layer, along a direction perpendicular to the side walls of the fin, a width of the sacrificial material layer is greater than 0.5 times the distance between adjacent fins and less than 3 times the distance between adjacent fins.

5. The method for forming a semiconductor structure according to claim 2, wherein the step of forming first dummy fins on side walls of the sacrificial layer comprises:
    forming a dummy fin material layer covering a top and side walls of the sacrificial layer in a conformal manner; and
    removing the dummy fin material layer on the top of the sacrificial layer and retaining the dummy fin material layer on the side walls of the sacrificial layer as the first dummy fin.

6. The method for forming a semiconductor structure according to claim 5, wherein the dummy fin material layer is formed using an atom layer deposition process or a chemical vapor deposition process.

7. The method for forming a semiconductor structure according to claim 2, wherein the sacrificial layer is formed using the atom layer deposition process or the chemical vapor deposition process.

8. The method for forming a semiconductor structure according to claim 2, wherein a material of the sacrificial layer is amorphous carbon or amorphous germanium.

9. The method for forming a semiconductor structure according to claim 2, wherein:
    the material of the sacrificial layer is amorphous carbon and a process for removing the sacrificial layer is an oxidization process; or
    the material of the sacrificial layer is amorphous germanium and the process for removing the sacrificial layer is a wet etch process.

10. The method for forming a semiconductor structure according to claim 9, wherein the wet etch process is performed using HCl vapor.

11. A method for forming a semiconductor structure, comprising:
    providing a base, wherein the base comprises a device region for forming devices and isolation regions located on two sides of the device region;
    patterning the base to form a substrate and fins protruding from the substrate;
    forming, on two sides of the device region, first dummy fins protruding from the substrate of the isolation region; and
    forming an isolation layer on the substrate exposed by the fins and the first dummy fins, wherein the isolation layer covers a part of side walls of the fin;
        wherein in the step of forming the first dummy fins, along the direction perpendicular to the side walls of the first dummy fin, a width of the first dummy fin is 1 time to 3 times a width of the fin.

12. The method for forming a semiconductor structure according to claim 1, wherein in the step of forming the first dummy fins, a top of the first dummy fin is flush with a top of the fin.

13. The method for forming a semiconductor structure according to claim 1, wherein in the step of forming the first dummy fins, a material of the first dummy fin is an insulating material.

14. A method for forming a semiconductor structure, comprising:
    providing a base, wherein the base comprises a device region for forming devices and isolation regions located on two sides of the device region;
    patterning the base to form a substrate and fins protruding from the substrate;
    forming, on two sides of the device region, first dummy fins protruding from the substrate of the isolation region; and
    forming an isolation layer on the substrate exposed by the fins and the first dummy fins, wherein the isolation layer covers a part of side walls of the fin;

wherein:
in the step of patterning the base, a fin mask film layer is formed on the top of the fin;
in the step of forming the first dummy fins, the material of the first dummy fin is the same as a material of the fin mask film layer; and
after forming the isolation layer, the forming method further comprises:
removing the fin mask film layer and partial thickness of the first dummy fin.

15. The method for forming a semiconductor structure according to claim 1, wherein in the step of forming the first dummy fins, the material of the first dummy fin is silicon nitride, silicon oxynitride or silicon carbide.

* * * * *